United States Patent
Liao et al.

(10) Patent No.: US 11,837,546 B2
(45) Date of Patent: *Dec. 5, 2023

(54) SELF-ALIGNED CAVITY STRUCUTRE

(71) Applicant: Taiwan Semiconductor Manufacturing Company, Ltd., Hsin-Chu (TW)

(72) Inventors: Wei-Hao Liao, Taichung (TW); Chung-Ju Lee, Hsinchu (TW); Chih Wei Lu, Hsinchu (TW); Hsi-Wen Tien, Xinfeng Township (TW); Yu-Teng Dai, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/714,428

(22) Filed: Apr. 6, 2022

(65) Prior Publication Data
US 2022/0230963 A1 Jul. 21, 2022

Related U.S. Application Data

(63) Continuation of application No. 16/898,705, filed on Jun. 11, 2020, now Pat. No. 11,302,641.

(51) Int. Cl.
*H01L 23/532* (2006.01)
*H01L 23/522* (2006.01)
*H01L 21/768* (2006.01)

(52) U.S. Cl.
CPC ...... *H01L 23/5329* (2013.01); *H01L 21/7682* (2013.01); *H01L 21/76834* (2013.01); *H01L 21/76885* (2013.01); *H01L 23/5226* (2013.01)

(58) Field of Classification Search
CPC ............ H01L 23/5329; H01L 21/7682; H01L 21/76885; H01L 23/5226; H01L 21/76834
See application file for complete search history.

(56) References Cited

U.S. PATENT DOCUMENTS

| | | |
|---|---|---|
| 6,287,979 B1 | 9/2001 | Zhou |
| 7,329,613 B2 | 2/2008 | Furukawa et al. |
| 9,281,277 B2 | 3/2016 | Baek |
| 9,390,965 B2 | 7/2016 | Yang et al. |

(Continued)

OTHER PUBLICATIONS

Stine et al. "Formation of Primary Amines on Silicon Nitride Surfaces: A Direct, Plasma-Based Pathway to Functionalization." Langmuir 2007, 23, 4400-4404, published Feb. 27, 2007.

(Continued)

*Primary Examiner* — Karen Kusumakar
(74) *Attorney, Agent, or Firm* — Eschweiler & Potashnik, LLC

(57) ABSTRACT

The present disclosure relates to an integrated chip comprising a pair of first metal lines over a substrate. A first interlayer dielectric (ILD) layer is laterally between the pair of first metal lines. The first ILD layer comprises a first dielectric material. A pair of spacers are on opposite sides of the first ILD layer and are laterally separated from the first ILD layer by a pair of cavities. The pair of spacers comprise a second dielectric material. Further, the pair of cavities are defined by opposing sidewalls of the first ILD layer and sidewalls of the pair of spacers that face the first ILD layer.

20 Claims, 9 Drawing Sheets

(56) References Cited

U.S. PATENT DOCUMENTS

| | | | |
|---|---|---|---|
| 2005/0074961 A1* | 4/2005 | Beyer | H01L 21/7682 257/E21.573 |
| 2008/0182403 A1 | 7/2008 | Noori | |
| 2009/0093100 A1 | 4/2009 | Xia | |
| 2009/0302475 A1 | 12/2009 | Korogi | |
| 2010/0001409 A1* | 1/2010 | Humbert | H01L 21/76831 257/E21.585 |
| 2010/0093168 A1 | 4/2010 | Naik | |
| 2012/0261788 A1 | 10/2012 | Lin | |
| 2015/0179582 A1 | 6/2015 | Baek | |
| 2015/0287682 A1 | 10/2015 | Ahn | |
| 2016/0293547 A1 | 10/2016 | Rha | |
| 2016/0379871 A1 | 12/2016 | Tsai et al. | |
| 2017/0278796 A1 | 9/2017 | Briggs | |
| 2020/0258772 A1 | 8/2020 | Hsieh | |
| 2020/0411427 A1 | 12/2020 | Lin | |
| 2021/0043498 A1* | 2/2021 | Lai | H01L 21/76834 |

OTHER PUBLICATIONS

Raphael et al. "Surface Modification and Grafting of Carbon Fibers: A Route to Better Interface." Progress in Crystal Growth and Characterization of Materials 64 (2018) 75-101, published Jul. 25, 2018.

U.S. Appl. No. 16/923,424, filed Jul. 8, 2020.
U.S. Appl. No. 17/236,234, filed Apr. 21, 2021.
U.S. Appl. No. 17/355,613, filed Jun. 23, 2021.
Non-Final Office Action dated Aug. 25, 2021 in connection with U.S. Appl. No. 16/923,424.
Non-Final Office Action dated Aug. 27, 2021 for U.S. Appl. No. 16/898,705.
Notice of Allowance dated Dec. 9, 2021 for U.S. Appl. No. 16/898,705.

\* cited by examiner

SELF-ALIGNED CAVITY STRUCUTRE

REFERENCE TO RELATED APPLICATION

This Application is a Continuation of U.S. application Ser. No. 16/898,705, filed on Jun. 11, 2020, the contents of which are hereby incorporated by reference in their entirety.

BACKGROUND

Many modern day integrated chips contain millions of semiconductor devices, such as active semiconductor devices (e.g., transistors) and/or passive semiconductor devices (e.g., resistors, diodes, capacitors). The semiconductor devices are electrically interconnected by way of back-end-of-the-line (BEOL) metal interconnect layers that are formed along interlayer dielectric (ILD) layers and above the semiconductor devices on an integrated chip. A typical integrated chip comprises a plurality of dielectric layers and a plurality of back-end-of-the-line metal interconnect layers including different sized metal wires vertically coupled together with metal contacts (i.e., vias).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
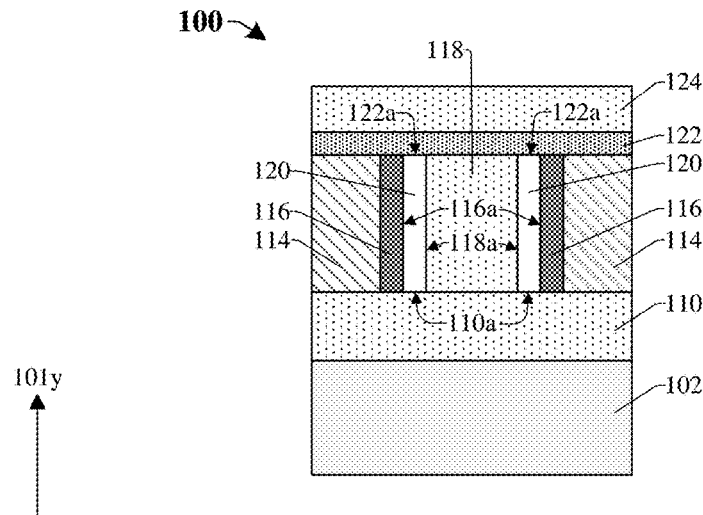
FIG. 1 illustrates a cross-sectional view of some embodiments of an integrated chip comprising a first interlayer dielectric (ILD) layer, a pair of spacers, and a pair of cavities between a pair of first metal lines.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip includes a plurality of metal lines over a substrate. The integrated chip also includes an interlayer dielectric (ILD) layer is over the substrate. Further, the first ILD layer laterally separates the plurality of first metal lines. The ILD layer comprises a dielectric material and is intended to electrically isolate the plurality of metal lines from one another. However, a capacitance exists between the plurality of metal lines that is dependent on the dielectric constant of the ILD layer between the plurality of metal lines. The capacitance between the plurality of metal lines contributes to a resistive-capacitive (RC) delay which affects a switching speed of the integrated chip. Further, the dielectric constant of the ILD layer may not be as low as desired to reduce the RC delay of the integrated chip. Thus, the integrated chip may experience an undesirable delay. As a result, an overall performance of the integrated chip may be less than desirable.

Various embodiments of the present disclosure are related to an integrated chip comprising cavities for improving a performance of the integrated chip, and a method for forming the integrated chip that provides for control of cavity placement and/or size. The integrated chip comprises a pair of first metal lines over a substrate. A first interlayer dielectric (ILD) layer is disposed laterally between the pair of first metal lines and the first ILD layer comprises a first dielectric material. A pair of spacers comprising a second dielectric material are disposed on opposite sides of the first ILD layer and are laterally separated from the first ILD layer by a pair of cavities. The pair of cavities are defined by opposing sidewalls of the first ILD layer and sidewalls of the pair of spacers that face the first ILD layer.

By including the cavities between the pair of first metal lines, a net dielectric constant between the pair of first metal lines (e.g. a net dielectric constant of the spacers, the cavities, and the ILD layer together) may be reduced. For example, the cavities may comprise air or some other substance that has a dielectric constant that is less than that of the first ILD layer and the spacers. Thus, a capacitance between the pair of first metal lines may also be reduced, thereby reducing a resistive-capacitive (RC) delay of the integrated chip. As a result, an overall performance of the integrated chip may be improved.

FIG. 1 illustrates a cross-sectional view of some embodiments of an integrated chip 100 comprising a first interlayer dielectric (ILD) layer 118, a pair of spacers 116, and a pair of cavities 120 between a pair of first metal lines 114.

In such embodiments, a dielectric layer 110 is disposed over a substrate 102. The pair of first metal lines 114 are disposed over the dielectric layer 110. The first ILD layer 118 is over the dielectric layer 110 and laterally between the pair of first metal lines 114. For example, the first ILD layer 118 is laterally adjacent to the pair of first metal lines 114. A pair of spacers 116 are over the dielectric layer 110 and on opposite sides of the first ILD layer 118. The pair of spacers 116 are disposed along sidewalls of the pair of first metal lines 114 that face the first ILD layer 118. Further, the pair of spacers 116 are laterally separated from the first ILD layer 118 by the pair of cavities 120. In some embodiments, the pair of spacers 116 are in direct contact with sidewalls of the pair of first metal lines 114.

Further, a first etch-stop layer 122 extends over the pair of first metal lines 114, the pair of spacers 116, the pair of cavities 120, and the first ILD layer 118. Furthermore, a second ILD layer 124 may be over the first etch-stop layer 122.

The pair of cavities 120 are defined by opposing sidewalls 118a of the first ILD layer 118, sidewalls 116a of the pair of spacers 116 that face the first ILD layer 118, one or more top surfaces 110a of the dielectric layer 110, and one or more bottom surfaces 122a of the first etch-stop layer 122. Further, the first ILD layer 118, the pair of cavities 120, and the pair of spacers 116 laterally separate the pair of first metal lines 114 from each other. The cavities 120 may, for example, be or comprise air gaps. Thus, the cavities 120 may, for example, comprise oxygen, nitrogen, or the like. Alternatively, the cavities 120 may comprise some other substance that has a dielectric constant that is less than that of the first ILD layer 118 and the spacers 116. A distance between the opposing sidewalls 118a of the first ILD layer 118 and the sidewalls 116a of the pair of spacers 116 defines a width of the cavities 120 and may be about 30 to 100 angstroms.

By including the pair of cavities 120 between the pair of first metal lines 114, a net dielectric constant between the pair of first metal lines 114 may be reduced. For example, the cavities 120 may comprise some substance, such as air or nitrogen, that has a dielectric constant that is less than that of the first ILD layer 118 and less than that of the spacers 116, thereby reducing the net dielectric constant between the pair of first metal lines 114. Thus, a capacitance between the pair of first metal lines 114 may also be reduced, thereby reducing a RC delay of the integrated chip 100. As a result, an overall performance of the integrated chip 100 may be improved.

Further, amines (not shown) may be disposed along the sidewalls 116a of the spacers 116. The amines may be on the sidewalls 116a of the spacers 116 as a result of aminating the sidewalls 116a of the spacers 116. For example, the amines may be or comprise $NH_2$, some other amine, or the like.

The substrate 102 may, for example, comprise silicon, some other semiconductor, or the like. Further, the dielectric layer 110 may, for example, comprise silicon dioxide, silicon nitride, aluminum oxide, some other metal-oxide, or the like.

The first metal lines 114 may, for example, comprise copper, tungsten, aluminum, ruthenium, molybdenum, osmium, iridium, cobalt, niobium, platinum, rhodium, rhenium, chromium, vanadium, palladium, some other suitable metal, or the like. The first metal lines 114 may have a thickness that extends along a y-axis 101y of about 200 to 500 angstroms or some other suitable thickness. Further, the first metal lines 114 may have a width that extends along an x-axis 101x of about 8 nanometers or more.

The spacers 116 may, for example, comprise silicon nitride, silicon oxynitride, silicon carbonitride, some other nitride, or the like. The spacers 116 may have a width that extends along the x-axis 101x of about 20 to 80 angstroms, some other suitable width, or the like.

Any of the first ILD layer 118 and the second ILD layer 124 may, for example, comprise silicon oxycarbide, silicon oxycarbonitirde, some Si—O—C composite film, some other low-k dielectric, or the like. Further, segments of the first ILD layer 118 may have a width that extends along the x-axis 101x of about 4 nanometers or more.

The first etch-stop layer 122 may, for example, comprise aluminum oxide, aluminum oxynitride, aluminum nitride, some other metal-oxide, some other metal-nitride, or the like.

Figure 2:
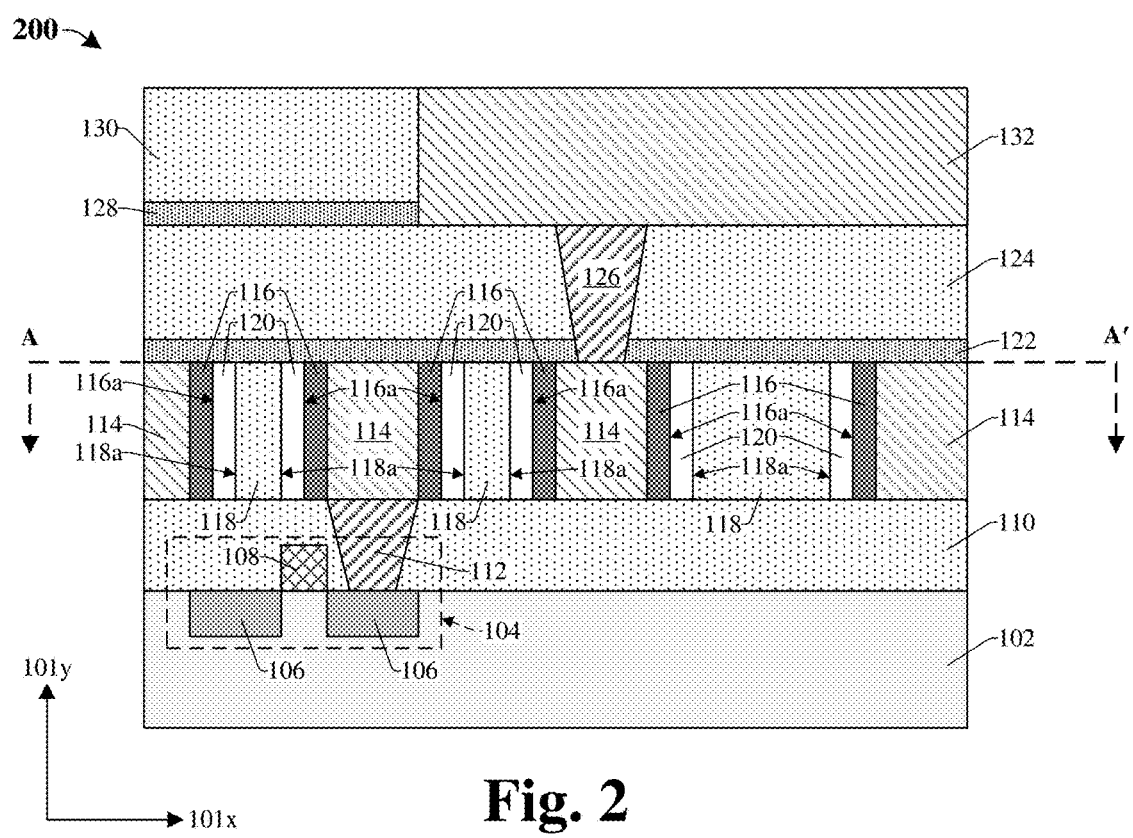
FIG. 2 illustrates a cross-sectional view of some embodiments of an integrated chip comprising a first interlayer dielectric (ILD) layer, spacers, and cavities between a plurality of first metal lines.

FIG. 2 illustrates a cross-sectional view of some embodiments of an integrated chip 200 comprising a first interlayer dielectric (ILD) layer 118, spacers 116, and cavities 120 between a plurality of first metal lines 114.

In such embodiments, a semiconductor device 104 may be disposed in and/or on a substrate 102. The semiconductor device 104 may comprise a pair of source/drain regions 106 and may further comprise a gate structure 108. Further, a contact 112 may extend through a dielectric layer 110 between the semiconductor device 104 and a first metal line 114. The contact 112 may electrically connect the semiconductor device 104 to one of the plurality of first metal lines 114.

Further, in some embodiments, the first ILD layer 118 may have separate segments comprising different widths. As a result, a pitch between some of the plurality of first metal lines 114 may vary throughout the integrated chip 200.

Furthermore, in some embodiments, a second ILD layer 124 may be over a first etch-stop layer 122, a second etch-stop layer 128 may be over the second ILD layer 124, and a third ILD layer 130 may be over the second etch-stop layer 128. In addition, a via 126 may be disposed over one of the first metal lines 114, and a second metal line 132 may be disposed over the via 126 within the third ILD layer 130. The via 126 may extend through a second ILD layer 124 and through the first etch-stop layer 122 from a bottom of the second metal line 132 to a top of one of the plurality of first metal lines 114.

The cavities 120 extend from a height that is approximately even with tops of the plurality of first metal lines 114 to a height that is approximately even with bottoms of the plurality of first metal lines 114. Thus, a net dielectric constant between the plurality of first metal lines 114 and along a full height of the plurality of first metal lines 114 may be reduced. As a result, a capacitance between the plurality of first metal lines 114 along the full height of the plurality of first metal lines 114 may also be reduced, thereby decreasing an RC delay of the integrated chip 200. Moreover, a net dielectric constant between the plurality of first metal lines 114 may be approximately constant along the full height of the plurality of first metal lines 114 (e.g. a net dielectric constant between the plurality of the first metal lines 114 at tops of the plurality of first metal lines 114 may be approximately equal to a net dielectric constant between the plurality of first metal lines 114 at bottoms of the plurality of first metal lines).

In some embodiments, the semiconductor device 104 may, for example, be a metal-oxide-semiconductor field-effect transistor (MOSFET), a junction field-effect transistor (JFET), an insulated-gate bipolar transistor (IGBT), a bipolar junction transistor (BJT), or the like. The source/drain regions 106 may comprise doped silicon or the like. The gate structure 108 may comprise polysilicon, metal, or some other suitable material. The contact 112 may comprise copper, tungsten, aluminum, titanium, tantalum, or the like.

Any of the aforementioned etch-stop layers (e.g., 122, 128) may comprise aluminum oxide, aluminum oxynitride, aluminum nitride, some other metal-oxide, some other metal-nitride, or the like. Any of the aforementioned ILD layers (e.g. 124, 130) may comprise silicon oxycarbide, silicon oxycarbonitirde, some Si—O—C composite films, some other suitable dielectric, or the like. Any of the aforementioned vias and metal lines (e.g. 124, 126) may comprise copper, titanium, tungsten, aluminum, ruthenium, tantalum, molybdenum, cobalt, or the like.

Figure 3:
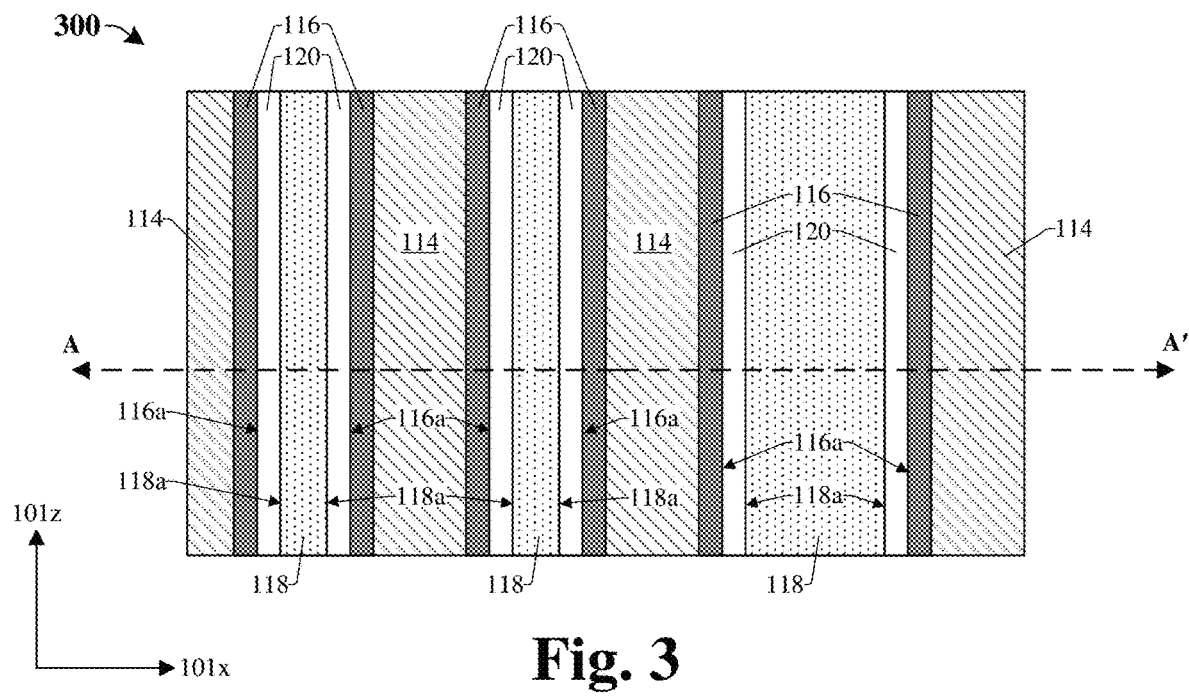
FIG. 3 illustrates a top view of some embodiments of an integrated chip comprising a first interlayer dielectric (ILD) layer, spacers, and cavities between a plurality of first metal lines.

FIG. 3 illustrates a top view of some embodiments of an integrated chip 300 comprising a first interlayer dielectric (ILD) layer 118, spacers 116, and cavities 120 between a plurality of first metal lines 114.

In such embodiments, the plurality of first metal lines 114, the spacers 116, the first ILD layer 118, and the cavities 120 have lengths that extend along a z-axis 101*z*. Further, in some embodiments, the lengths of any of the plurality of first metal lines 114, the spacers 116, the first ILD layer 118, and the cavities 120 may be approximately equal.

Figure 4:
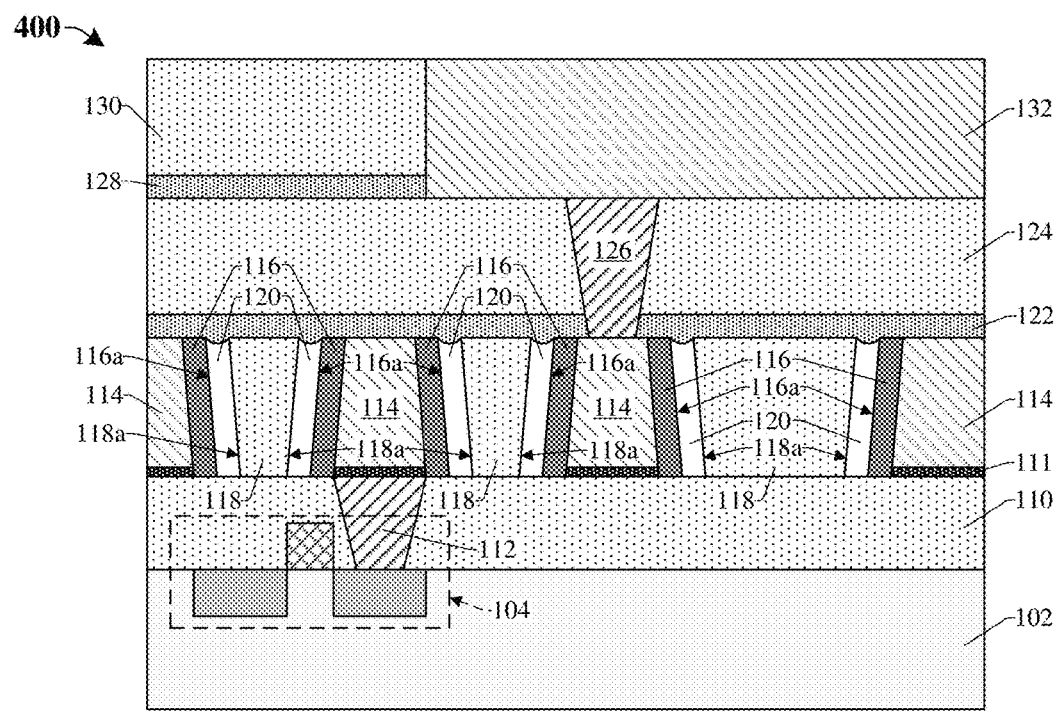
FIG. 4 illustrates a cross-sectional view of some embodiments of an integrated chip comprising a first interlayer dielectric layer that has wider top surfaces than bottom surfaces.

FIG. 4 illustrates a cross-sectional view of some embodiments of an integrated chip 400 comprising a first ILD layer 118 that has wider top surfaces than respective bottom surfaces.

In such embodiments, the plurality of first metal lines 114 have wider bottom surfaces than respective top surfaces. Thus, angles between sidewalls of the plurality of first metal lines 114 and bottom surfaces of the plurality of first metal lines 114 may be less than 90 degrees. Further, angles between sidewalls 116*a* of the spacers 116 that face the first ILD layer 118 and bottom surfaces of the spacers 116 may be less than 90 degrees. Furthermore, angles between sidewalls of the first ILD layer 118 and bottom surfaces of the first ILD layer 118 may be greater than 90 degrees. This geometry of the plurality of first metal lines 114, the spacers 116, and the first ILD layer 118 may be the result of performing a patterning process on a metal layer to define the plurality of first metal lines 114 (see, for example, FIGS. 7 and 8) and subsequently forming the spacers 116 and/or the first ILD layer 118 between the plurality of first metal lines 114 (see, for example, FIGS. 9 and 13).

In addition, in some embodiments, a first etch-stop layer 122 may have curved bottom surfaces that define tops of cavities 120. This may be the result of forming the first etch-stop layer 122 over the cavities 120 (see, for example, FIG. 16).

Further, a glue layer 111 may be disposed along bottom surfaces of the first metal lines 114, but not along bottom surfaces of the spacers 116 nor bottom surfaces of the first ILD layer 118. This may be the result of removing the glue layer 111 when performing a patterning process that defines the first metal lines 114. The glue layer 111 may, for example, comprise tantalum, tantalum nitride, titanium, titanium nitride, or the like. Further, the glue layer 111 may have a thickness of about 5 to 20 angstroms or some other suitable thickness. In some embodiments, the glue layer 111 is included in the integrated chip 400 to improve an adhesion of the plurality of first metal lines 114 to the dielectric layer 110.

Figure 5:
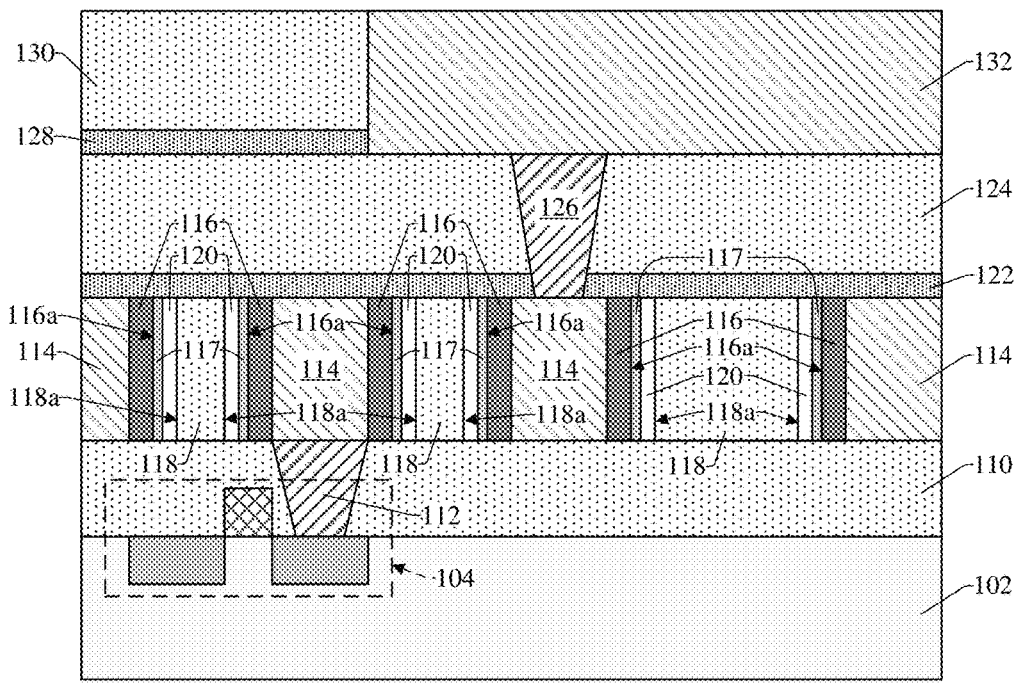
FIG. 5 illustrates a cross-sectional view of some embodiments of an integrated chip comprising one or more sacrificial layers along sidewalls of a pair of spacers that face a first ILD layer.

FIG. 5 illustrates a cross-sectional view of some embodiments of an integrated chip 500 comprising one or more sacrificial layers 117 along sidewalls 116*a* of a pair of spacers 116 that face a first ILD layer 118. As a result, the cavities 120 are defined, in part, by sidewalls of the one or more sacrificial layers 117 that face the first ILD layer 118.

Figure 15:
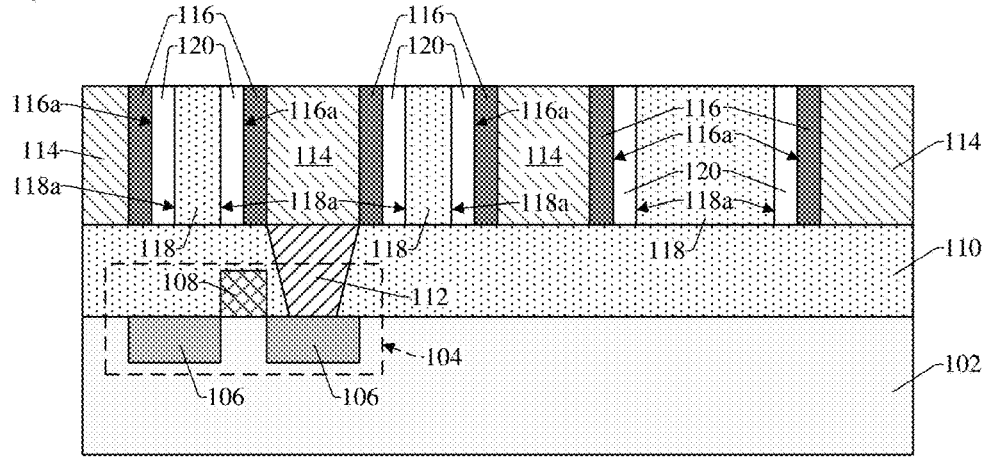

The one or more sacrificial layers 117 may be disposed along the sidewalls 116*a* of the spacers 116 that face the first ILD layer 118 due to the one or more sacrificial layer 117 not being completely removed from the spacers 116 during a sacrificial layer removal process (see, for example, FIG. 15).

Although FIG. 5 illustrates the one or more sacrificial layers 117 as being disposed along both sidewalls 116*a* of the spacers 116 that face the first ILD layer 118, it will be appreciated that in some embodiments, the one or more sacrificial layers 117 may only be disposed on one of the sidewalls 116*a* of the spacers 116.

Figure 6:
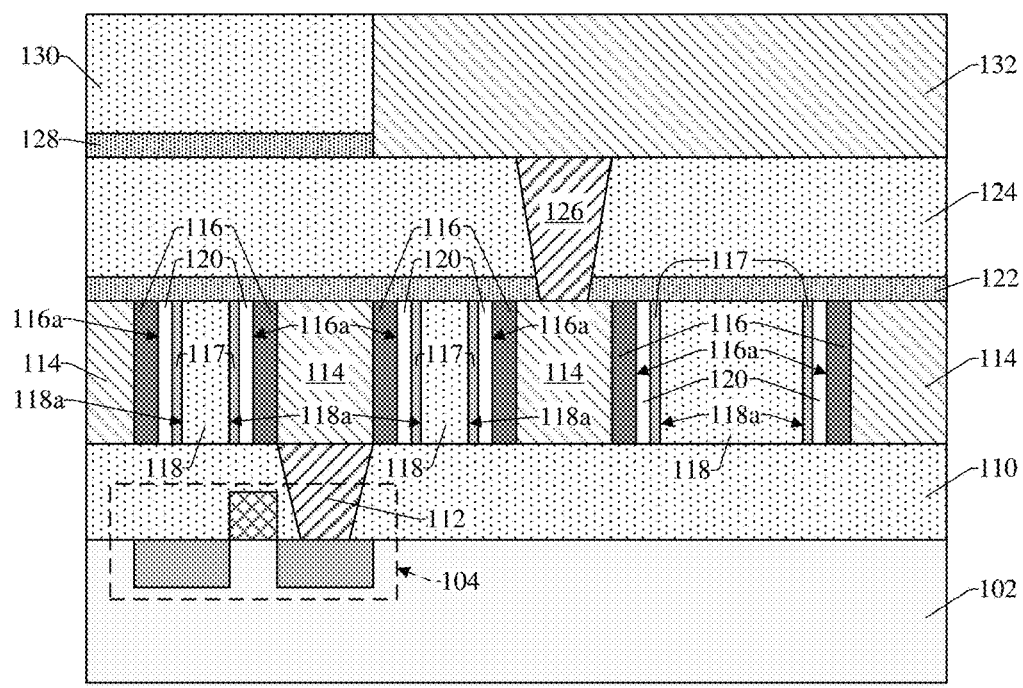
FIG. 6 illustrates a cross-sectional view of some embodiments of an integrated chip comprising one or more sacrificial layers along opposing sidewalls of a first ILD layer.

FIG. 6 illustrates a cross-sectional view of some embodiments of an integrated chip 600 comprising one or more sacrificial layers 117 along opposing sidewalls 118*a* of a first ILD layer 118. As a result, the cavities 120 are defined, in part, by sidewalls of the one or more sacrificial layers 117 that face the spacers 116.

The one or more sacrificial layers 117 may be disposed along the opposing sidewalls 118*a* of the first ILD layer 118 due to the one or more sacrificial layers 117 not being completely removed from the first ILD layer 118 during a sacrificial layer removal process (see, for example, FIG. 15).

Although FIG. 6 illustrates the one or more sacrificial layers 117 as being disposed along both opposing sidewalls 118*a* of the first ILD layer 118, it will be appreciated that in some embodiments, the one or more sacrificial layers 117 may only be disposed on one of the opposing sidewalls 118*a* of the first ILD layer 118.

In some embodiments, any of the one or more sacrificial layers 117 illustrated in FIGS. 5 and 6 may, for example, comprise epoxide terminated carbon chains, carbonic acid terminated carbon chains, anhydrate terminated carbon chains, hydroxyl terminated carbon chains, or the like. Any of the aforementioned carbon chains may, for example, have a molecular weight of about 2000 to 200,000 grams/mole.

FIGS. 7-17 illustrate cross-sectional views 700-1700 of some embodiments of a method for forming an integrated chip comprising a first interlayer dielectric (ILD) layer 118, spacers 116, and cavities 120 between a plurality of first metal lines 114. Although FIGS. 7-17 are described in relation to a method, it will be appreciated that the structures disclosed in FIGS. 7-17 are not limited to such a method, but instead may stand alone as structures independent of the method.

Figure 7:
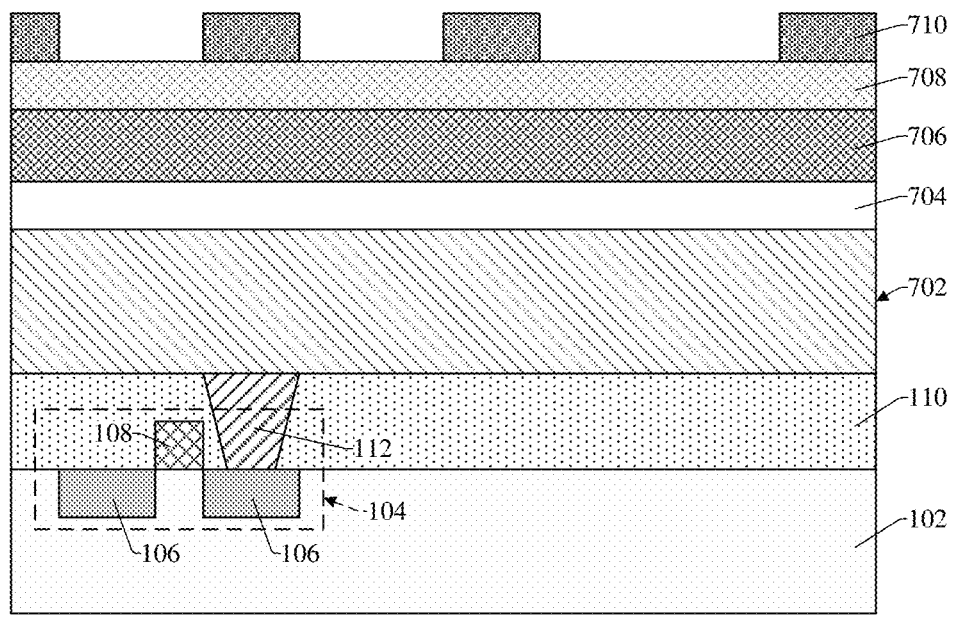
FIGS. 7-17 illustrate cross-sectional views of some embodiments of a method for forming an integrated chip comprising a first interlayer dielectric (ILD) layer, spacers, and cavities between a plurality of first metal lines.

As shown in cross-sectional view 700 of FIG. 7, a semiconductor device 104 is formed in a substrate 102, a dielectric layer 110 is formed over the substrate 102, and a contact 112 is formed within the dielectric layer 110. The semiconductor device 104 may, for example, comprise performing an ion implantation process or the like to form the pair of source/drain regions 106, depositing a gate material such as, for example, polysilicon, metal, or the like over the substrate 102, and patterning the gate material to form the gate structure 108. The dielectric layer 110 may be formed by depositing a dielectric by a chemical vapor deposition (CVD) process, a physical vapor deposition (PVD) process, an atomic layer deposition (ALD) process, a spin on process, or the like. The contact 112 may, for example, be formed by patterning the dielectric layer 110 and subsequently depositing a metal by a sputtering process, an electroplating process, or the like.

Further, a first metal material 702 is deposited over the dielectric layer 110 and the contact 112 by a sputtering process, an electroplating process, a PVD process, an ALD process, some other suitable metal deposition process, or the like at a temperature of about 10 to 450 degrees Celsius.

In some embodiments, a glue layer (e.g., 111 of FIG. 4) is formed over the dielectric layer 110 before the first metal material 702 is deposited. The glue layer 111 may, for example, be formed by PVD, ALD, or the like at a temperature of about 10 to 400 degrees Celsius.

In addition, a hard mask 704 is formed over the first metal material 702. The hard mask 704 may, for example, comprise silicon dioxide, silicon carbide, titanium oxide, tantalum oxide, aluminum oxide, some other suitable metal oxide, or the like. The hard mask 704 may be formed by a CVD process, a PVD process, an ALD process, another suitable deposition process, or the like at a temperature of about 10 to 400 degrees Celsius. The hard mask 704 may have a thickness of about 100 to 250 angstroms.

Further, a bottom layer 706 may be formed over the hard mask 704, a middle layer 708 may be formed over the bottom layer 706, and a photoresist mask 710 may be formed over the middle layer 708. The bottom layer 706 may comprise an oxide based material, some other suitable material, or the like, and may be deposited by a CVD process, a PVD process, an ALD process, a spin on process, or the like. The middle layer 708 may comprise a carbon based material, some other suitable material, or the like, and may be deposited by a CVD process, a PVD process, an ALD process, a spin on process, or the like.

Figure 8:
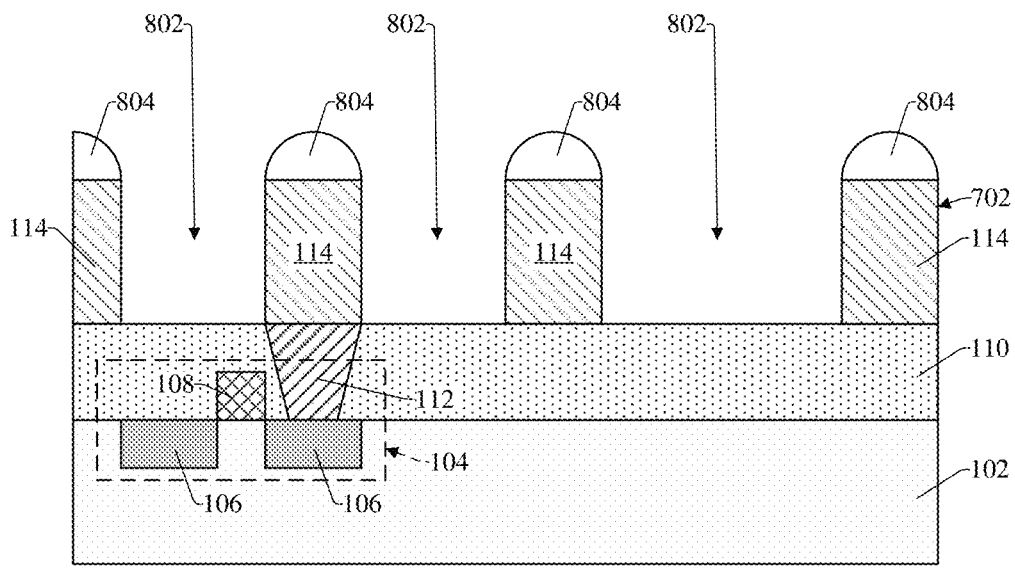

As shown in cross-sectional view 800 of FIG. 8, the hard mask 704 and the first metal material 702 are patterned to define a plurality of first metal lines 114, to form first openings 802 between the plurality of first metal lines 114 that are defined by sidewalls of the first metal lines 114, and to define a patterned hard mask 804 over tops of the first metal lines 114.

The patterning may, for example, comprise any of a photolithography process and an etching process. The etching process may comprise a wet etching process, a dry etching process, or some other suitable etching process.

The wet etching process may, for example, utilize hydrofluoric acid, hydrochloric acid, phosphoric acid, acetic acid, nitric acid, sulfuric acid, potassium hydroxide, tetramethylammonium hydroxide, or the like.

The dry etching process may, for example, comprise an inductively coupled plasma (ICP) reactive ion etching (RIE) process which may utilize a power of about 100 to 2000 watts, a bias voltage of about 0 to 1200 volts, and any of hydrogen bromide, chlorine, hydrogen, methane, nitrogen, helium, neon, krypton, tetrafluoromethane, trifluoromethane, fluoromethane, difluoromethane, octafluorocyclobutane, hexafluoro-1,3-butadiene, oxygen, argon, some other suitable gas, or the like.

For example, the patterning may comprise etching the middle layer 708 with the photoresist in place to form a patterned middle layer (not shown), etching the bottom layer 706 with the patterned middle layer in place to form a patterned bottom layer (not shown), etching the hard mask 704 with the patterned bottom layer in place to form a patterned hard mask 804, and etching the first metal material 702 with the patterned hard mask 804 in place to define the plurality of first metal lines 114. The rounded tops of the patterned hard mask may be the result of etching the first metal material 702 with the patterned hard mask 804 in place (e.g., some of the patterned hard mask 804 may be removed during the etching of the first metal material 702).

Further, an etch rate of the first metal material 702 may be greater than that of the hard mask 704 and/or the patterned hard mask 804 by a factor of 8 or more during the patterning (e.g. the first metal material 702 may be etched 8 times faster than the hard mask 704 and/or the patterned hard mask 804). Furthermore, the an etch rate of the first metal material 702 may be greater than that of the dielectric layer 110 and/or the glue layer (e.g. 111 of FIG. 4) by a factor of 5 or more during the patterning (e.g. the first metal material 702 may be etched 5 times faster than the dielectric layer 110 and/or the glue layer).

Figure 9:
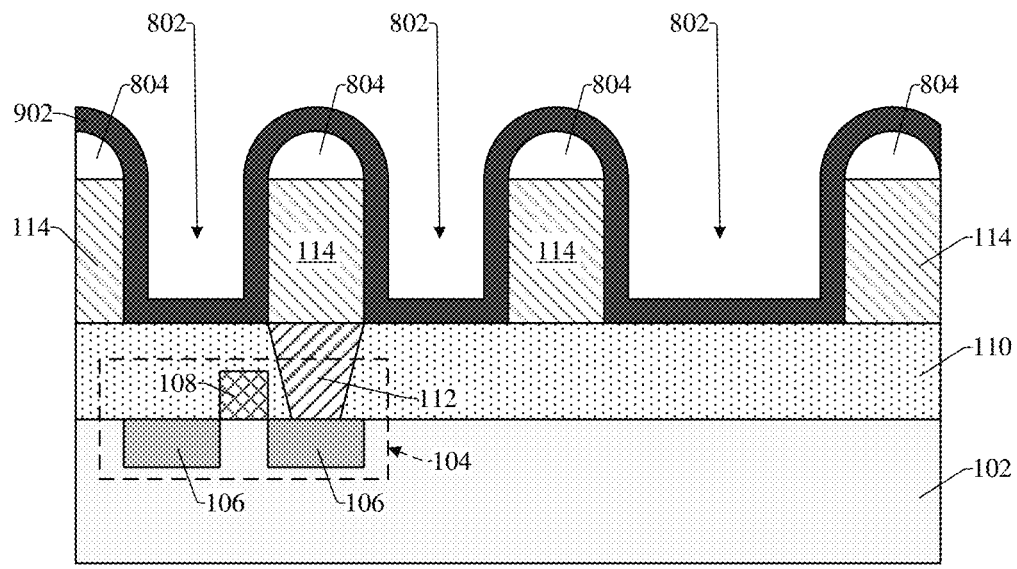

As shown in cross-sectional view 900 of FIG. 9, a spacer precursor layer 902 is conformally formed over the patterned hard mask 804, along sidewalls of the first metal lines 114, and along top surfaces of the dielectric layer 110 that define the first openings 802. The spacer precursor layer 902 may, for example, comprise silicon nitride, silicon oxynitride, silicon carbonitride, some other suitable material, or the like. Further, the spacer precursor layer 902 may be formed by a plasma enhanced CVD (PECVD) process, an ALD process, or the like at a temperature of about 180 to 350 degrees Celsius. The thickness of the spacer precursor layer 902 may be about 30 to 80 angstroms.

Figure 10:
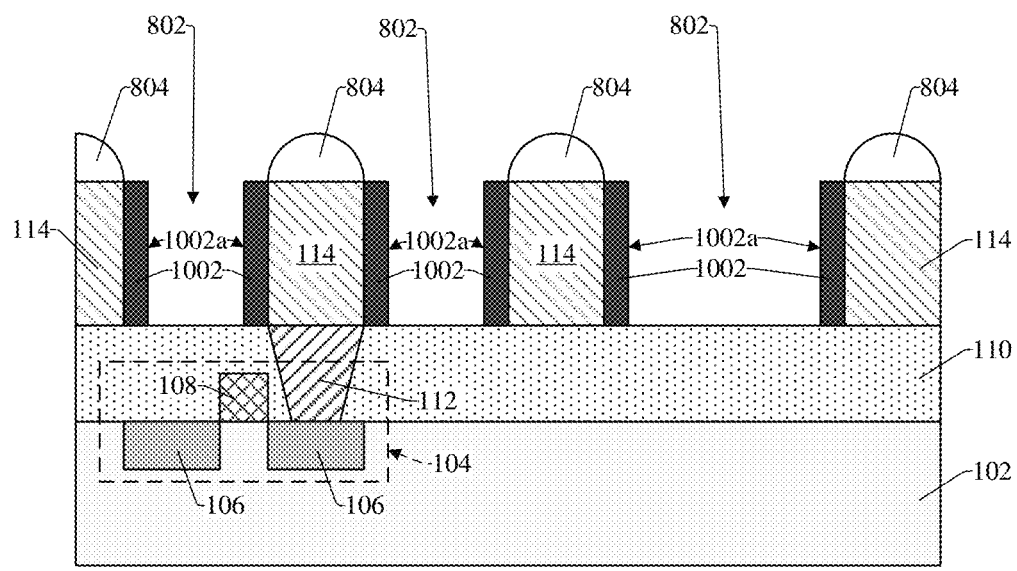

As shown in cross-sectional view 1000 of FIG. 10, the spacer precursor layer 902 is patterned to define spacer precursors 1002 along sidewalls of the first metal lines 114. The patterning may comprise a dry etching process. For example, the patterning may comprise an ICP RIE process that may utilize, a power of about 100 to 2000 watts, a voltage of about 0 to 1200 volts, and any of hydrogen bromide, chlorine, hydrogen, methane, nitrogen, helium, neon, krypton, oxygen, argon, or the like. The patterning may, for example, exhibit a high selectivity to the spacer precursor layer 902 relative to the patterned hard mask 804.

Figure 11:
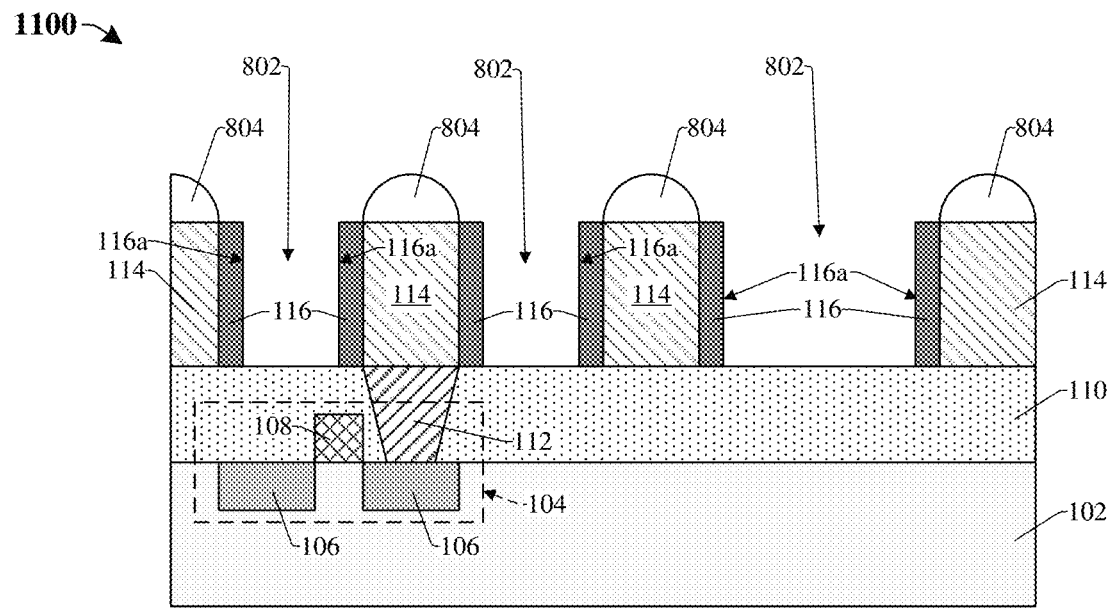

As shown in cross-sectional view 1100 of FIG. 11, sidewalls 1002a of the spacer precursors 1002 may be modified to form spacers 116. The modification may comprise forming one or more organic compounds along the sidewalls 1002a of the spacer precursors 1002. In some embodiments, the modification may comprise aminating the sidewalls 1002a of the spacer precursors 1002 (e.g., one or more amines may be formed on the sidewalls 1002a of the spacer precursors 1002). Thus, the spacers 116 have sidewalls 116a that comprise one or more amines.

For example, $NH_2$ or some other amine may be formed along the sidewalls 1002a of the spacer precursors 1002. The modification may be achieved by way of a plasma process that may comprise exposing the spacer precursors 1002 to a plasma. For example, the spacer precursors 1002 may be exposed to a plasma via an ICP process that may utilize a power of about 500 to 2000 watts, a bias voltage of about 0 to 300 volts, and any of water, hydrogen, methane, or the like.

Figure 12:
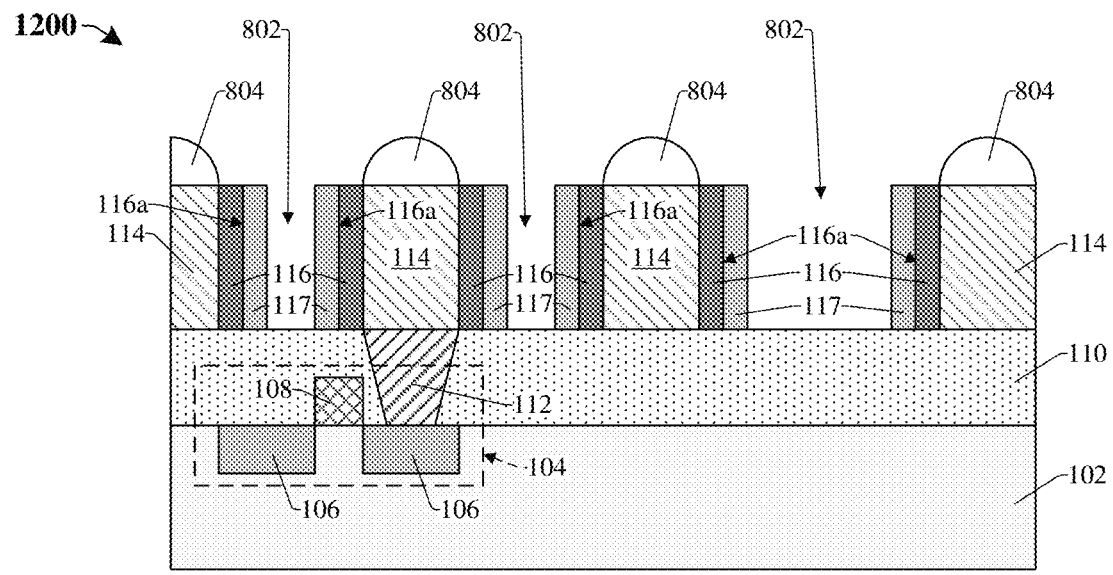

As shown in cross-sectional view 1200 of FIG. 12, one or more sacrificial layers 117 are formed along sidewalls 116a of the spacers 116. The one or more sacrificial layers 117 may be selectively formed on the sidewalls 116a of the spacers 116 by a grafting process. For example, the grafting process may comprise exposing the sidewalls 116a of the spacers 116 to a grafting solution at a temperature of about 0 to 60 degrees Celsius. The grafting solution may comprise 3 to 30 percent carbon chains and a remaining portion of the grafting solution may comprise tetrahydrofuran (THF), dimethylacetamide (DMAc), methanol, acetone, or the like. The carbon chains may, for example, have a molecular weight of about 2,000 to 200,000 grams/mole and the carbon chains may, for example, be terminated by an epoxide, a carbonic acid, an anhydrate, a hydroxyl, some other suitable functional group, or the like. Further, the one or more sacrificial layers 117 may have a width of about 30 to 100 angstroms.

When exposing the sidewalls 116a of the spacers 116 to the grafting solution, the one or more amines on the sidewalls 116a of the spacers 116 may react with the functional group (e.g., an epoxide, a carbonic acid, an anhydrate, a hydroxyl) that terminates the carbon chains. As a result, the carbon chains may be bonded to the one or more amines on the sidewalls 116a of the spacers 116, thereby forming the one or more sacrificial layers 117 on the sidewalls 116a of the spacers 116.

By forming one or more amines on the sidewalls 1002a of the spacer precursors 1002, the one or more sacrificial layers 117 are able to be selectively grafted along the sidewalls 116a of spacers 116. Thus, a relatively high control of the formation of the one or more sacrificial layers 117 may be achieved.

Figure 13:
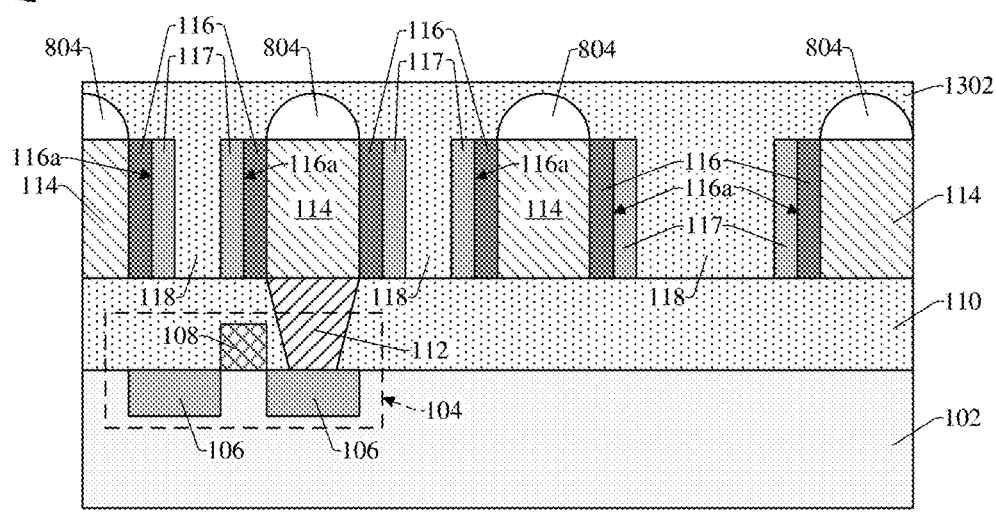

As shown in cross-sectional view 1300 of FIG. 13, a dielectric material 1302 is deposited over the patterned hard mask 804, over the spacers 116, over the one or more sacrificial layers 117, and between sidewalls of the one or more sacrificial layers 117 to form a first ILD layer 118 between the sidewalls of the one or more sacrificial layers 117. The dielectric material 1302 may, for example, comprise silicon oxycarbide, silicon oxycarbonitirde, some Si—O—C composite films, some other suitable dielectric, or the like, and may be deposited by a CVD process, a PVD process, an ALD process, a spin-on process, or the like.

Figure 14:
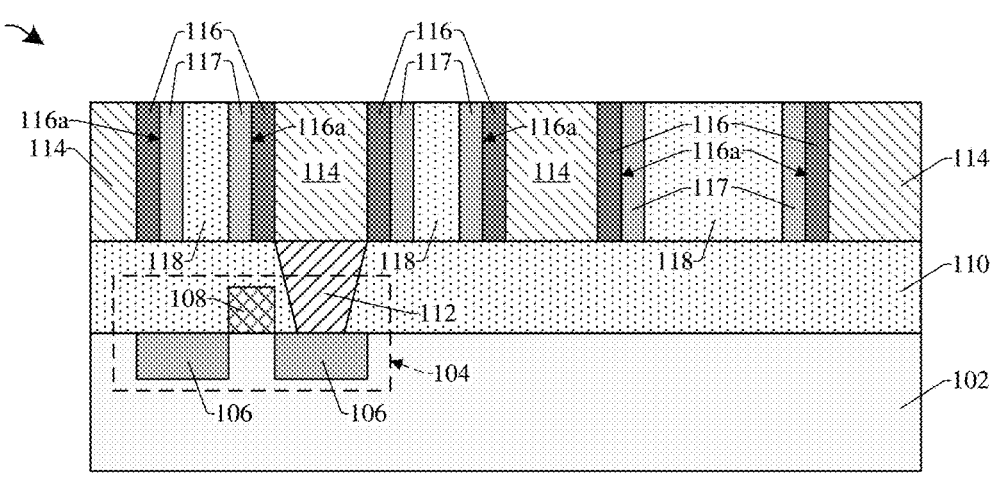

As shown in cross-sectional view 1400 of FIG. 14, a planarization process is performed on the dielectric material 1302 to remove the dielectric material from over the sacrificial layer 117 and from over the spacers 116. The planarization also removes the patterned hard mask 804. As a result, top surfaces of the first metal lines 114, top surfaces of the one or more sacrificial layers 117, top surfaces of the spacers 116, and top surfaces of the first ILD layer 118 may be aligned. The planarization process may further define the first ILD layer 118. The planarization process may, for example, comprise a chemical mechanical planarization (CMP), some other suitable planarization process, or the like.

As shown in cross-sectional view 1500 of FIG. 15, the one or more sacrificial layers 117 are removed, thereby leaving cavities 120 in their place. The cavities 120 are thus defined, at least in part, by opposing sidewalls 118a of the first ILD layer 118, sidewalls 116a of the spacers 116 that face the first ILD layer 118, and a top surface of the dielectric layer 110. The one or more sacrificial layers 117 may be removed by a heating process. For example, the heating process may comprise heating the integrated chip, including the one or more sacrificial layers 117, to about 100 to 400 degrees Celsius in an oven or some other suitable heating apparatus for a predetermined amount of time. Although the one or more sacrificial layers 117 may be removed by a heating process, some other process (e.g., an etching process or the like) may alternatively be used to remove the one or more sacrificial layers 117.

In some embodiments, the one or more amines (not shown) may remain on the sidewalls 116a of the spacers 116 after the one or more sacrificial layers 117 are removed. Alternatively, in some embodiments, the one or more amines may be removed from the sidewalls 116a of the spacers 116 during the removal of the one or more sacrificial layers 117.

Further, in some embodiments, one or more portions of the one or more sacrificial layers 117 may remain on the sidewalls 116a of the spacers 116 after the sacrificial layer removal process (see, for example, FIG. 5). Furthermore, in some other embodiments, one or more potions of the one or more sacrificial layers 117 may remain on opposing sidewalls 118a of the first ILD layer 118 after the sacrificial layer removal process (see, for example, FIG. 6).

Due to the relatively high control of the formation of the one or more sacrificial layers 117, a relatively high control of the formation of the cavities 120 may also be achieved. For example, since the one or more sacrificial layers 117 can be selectively grafted in a particular location and/or to a particular size and are subsequently removed to form the cavities 120, control of the location and/or size of the cavities 120 may also be achieved.

By achieving a high control of the formation of the cavities 120, widths of the cavities 120 (e.g., a distance between sidewalls of the first ILD layer 118 and neighboring sidewalls of the spacers 116) may be approximately uniform from tops of the cavities 120 to bottoms of the cavities 120. For example, widths of the cavities 120 may vary along heights of the cavities 120 (e.g., from tops of the cavities 120 to bottoms of the cavities 120) by less than about 5 percent, by less than about 10 percent, or some other suitable percentage.

Figure 16:
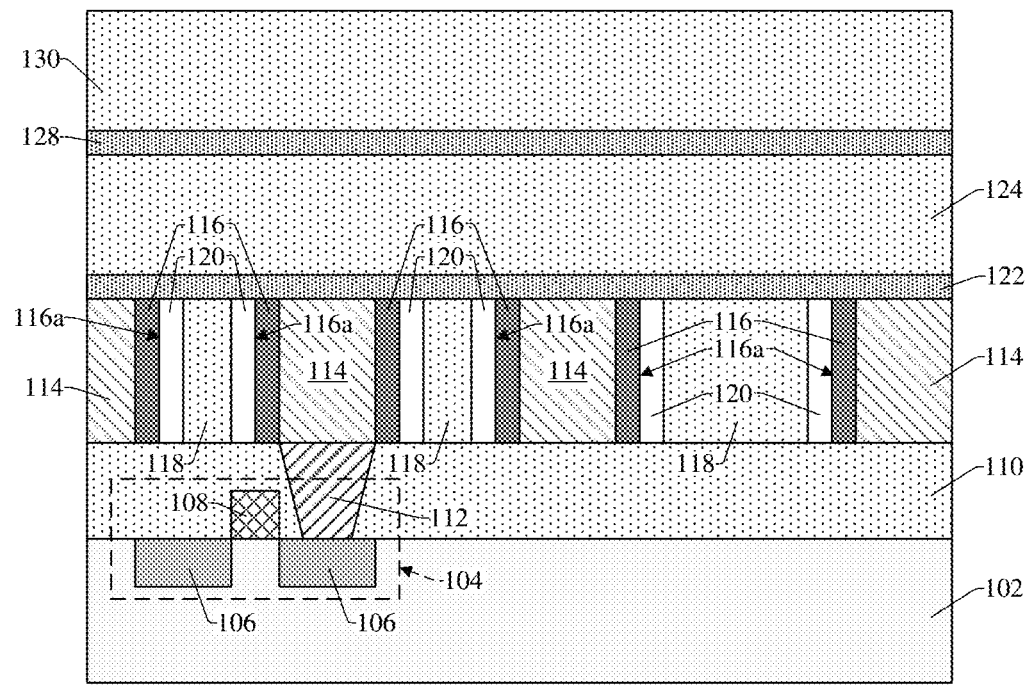

As shown in cross-sectional view 1600 of FIG. 16, a first etch-stop layer 122 is formed over the first metal lines 114, over the spacers 116, over the first ILD layer 118, and over the cavities 120. Thus, one or more bottom surfaces of the first etch-stop layer 122 partially define the cavities 120. In addition, a second ILD layer 124 may be formed over the first etch-stop layer 122, a second etch-stop layer 128 may be formed over the second ILD layer 124, and a third ILD layer 130 may be formed over the second etch-stop layer 128. Any of the aforementioned layers may be formed by CVD, PVD, ALD, some other suitable process, or the like.

In some embodiments, the first etch-stop layer 122 has curved lower surfaces that define the tops of the cavities 120 (see, for example, FIG. 4). The curved lower surfaces may be the result of depositing the first etch-stop layer 122 over the cavities 120.

Figure 17:
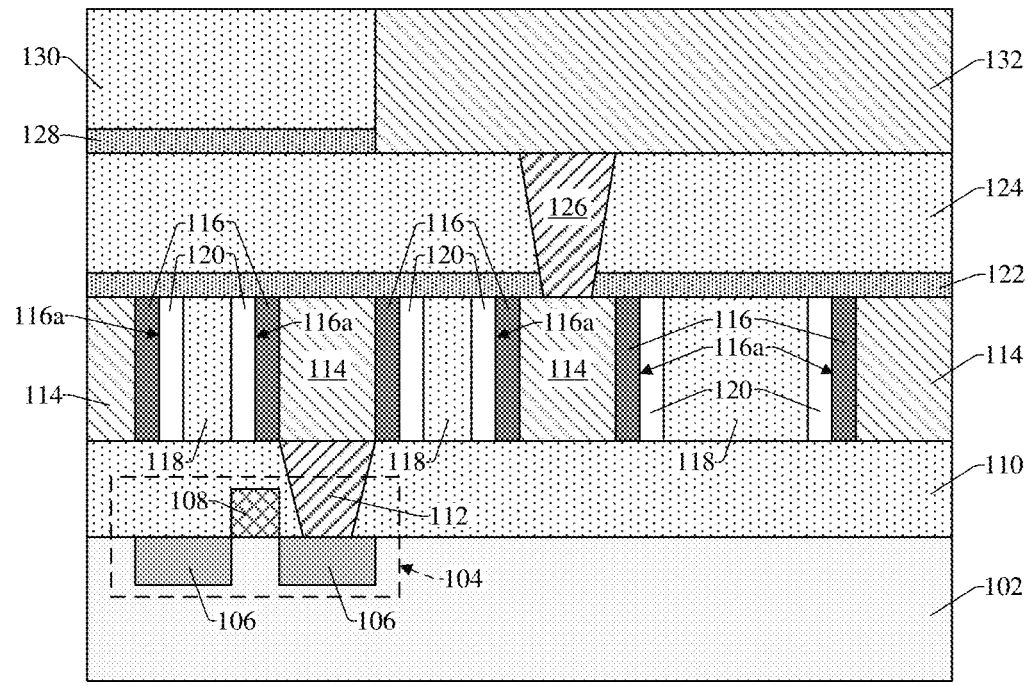

As shown in cross-sectional view 1700 of FIG. 17, a via 126 and a second metal line 132 may be formed over the plurality of first metal lines 114. Forming the via 126 and the second metal line 132 may, for example, comprise patterning any of the first etch-stop layer 122, the second ILD layer 124, the second etch-stop layer 128, and the third ILD layer 130 to form openings in any of the aforementioned layers (e.g., 122, 124, 128, 130), and subsequently depositing one or more metal materials in any of the openings.

Although the formation of the via 126 and the second metal line 132 is illustrated as a dual damascene process or the like, some other metal formation process (e.g., a single damascene process, a metal patterning process, etc.) may be alternatively performed to form any of the via 126 and the second metal line 132.

Figure 18:
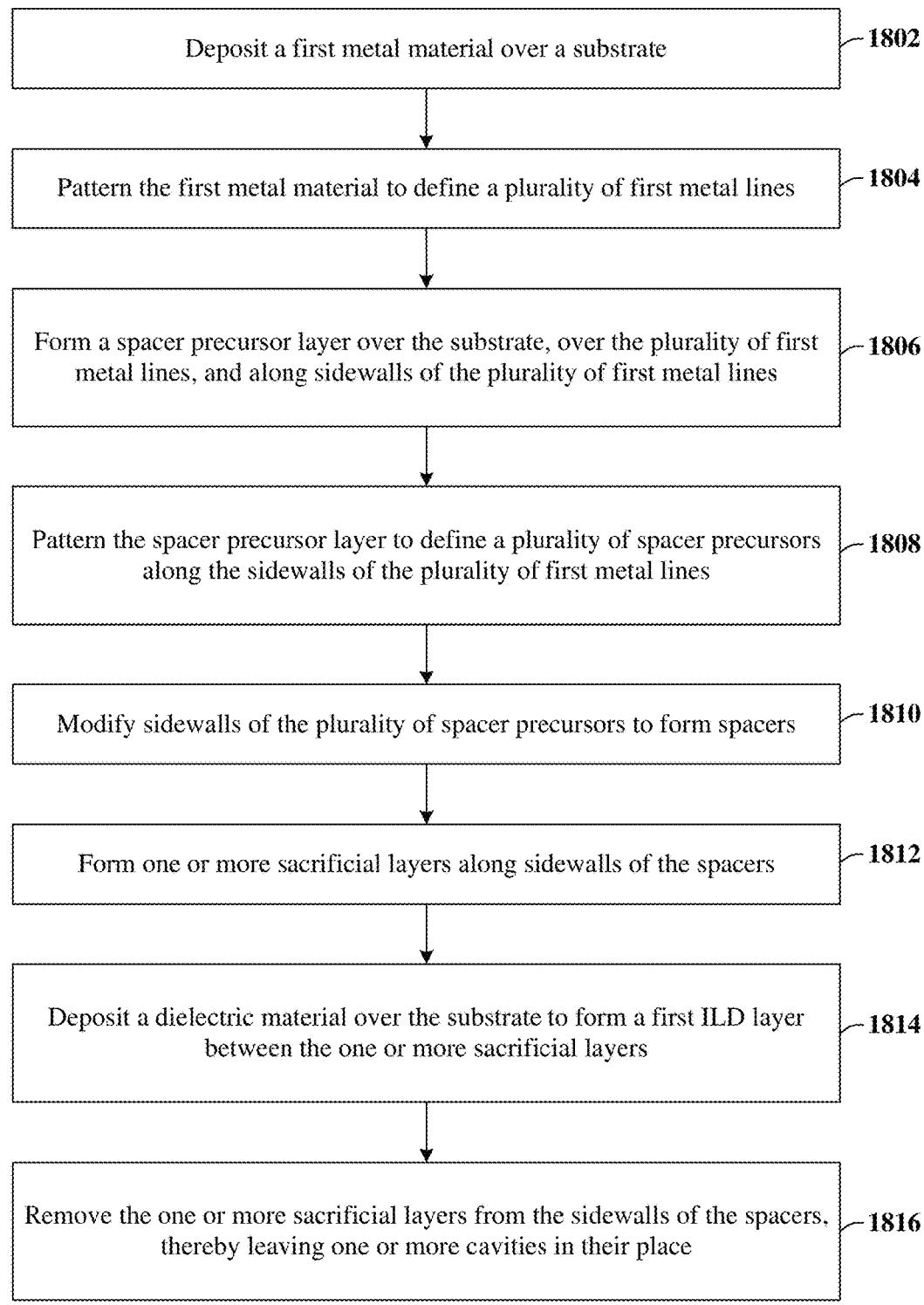
FIG. 18 illustrates a flow diagram of some embodiments of a method for forming an integrated chip comprising a first interlayer dielectric (ILD) layer, spacers, and cavities between a plurality of first metal lines.

FIG. 18 illustrates a flow diagram of some embodiments of a method 1800 for forming an integrated chip comprising a first interlayer dielectric (ILD) layer, spacers, and cavities between a plurality of first metal lines. While method 1800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, a first metal material is deposited over a substrate. FIG. 7 illustrates a cross-sectional view 700 of some embodiments corresponding to act 1802.

At 1804, the first metal material is patterned to define a plurality of first metal lines. FIG. 8 illustrates a cross-sectional view 800 of some embodiments corresponding to act 1804.

At 1806, a spacer precursor layer is formed over the substrate, over the plurality of first metal lines, and along sidewalls of the plurality of first metal lines. FIG. 9 illustrates a cross-sectional view 900 of some embodiments corresponding to act 1806.

At 1808, the spacer precursor layer is patterned to define a plurality of spacer precursors along the sidewalls of the plurality of first metal lines. FIG. 10 illustrates a cross-sectional view 1000 of some embodiments corresponding to act 1808.

At 1810, sidewalls of the plurality of spacer precursors are modified to form spacers. FIG. 11 illustrates a cross-sectional view 1100 of some embodiments corresponding to act 1810.

At 1812, one or more sacrificial layers are formed along sidewalls of the spacers. FIG. 12 illustrates a cross-sectional view 1200 of some embodiments corresponding to act 1812.

At 1814, a dielectric material is deposited over the substrate to form a first ILD layer between the one or more sacrificial layers. FIG. 13 illustrates a cross-sectional view 1300 of some embodiments corresponding to act 1814.

At 1816, the one or more sacrificial layers are removed from the sidewalls of the spacers, thereby leaving one or more cavities in their place. FIG. 15 illustrates a cross-sectional view 1500 of some embodiments corresponding to act 1816.

Thus, the present disclosure relates to an integrated chip comprising cavities for improving a performance of the integrated chip, and a method for forming the integrated chip that provides for control of cavity placement and/or size.

Accordingly, in some embodiments, the present disclosure relates to an integrated chip comprising a pair of first metal lines over a substrate. A first interlayer dielectric (ILD) layer is laterally between the pair of first metal lines. The first ILD layer comprises a first dielectric material. A pair of spacers are on opposite sides of the first ILD layer and are laterally separated from the first ILD layer by a pair of cavities. The pair of spacers comprise a second dielectric material. Further, the pair of cavities are defined by opposing sidewalls of the first ILD layer and sidewalls of the pair of spacers that face the first ILD layer.

In other embodiments, the present disclosure relates to an integrated chip comprising a dielectric layer over a substrate. A first metal line is over the dielectric layer. A first interlayer dielectric (ILD) layer is over the dielectric layer and is laterally adjacent to the first metal line. The first ILD layer comprises a first dielectric material. A pair of spacers are over the dielectric layer and on opposite sides of the first ILD layer. The pair of spacers comprise a second dielectric material different from the first dielectric material. An etch-stop layer is over the first ILD layer and over the pair of spacers. Further, opposing sidewalls of the first ILD layer, sidewalls of the pair of spacers that face the first ILD layer, one or more bottom surfaces of the etch-stop layer, and one or more top surfaces of the dielectric layer define a pair of cavities that laterally separate the sidewalls of the pair of spacers that face the first ILD layer from the opposing sidewalls of the first ILD layer, respectively.

In yet other embodiments, the present disclosure relates to a method for forming an integrated chip. The method comprises depositing a first metal over a substrate. The first metal is patterned to define a plurality of first metal lines. A spacer precursor layer is formed over the first metal lines and on sidewalls of the plurality of first metal lines. The spacer precursor layer is patterned to form a plurality of spacer precursors along the sidewalls of the plurality of first metal lines. Sidewalls of the plurality of spacer precursors are modified to form a plurality of spacers. Modifying the sidewalls of the plurality of spacer precursors comprises forming one or more organic compounds along the sidewalls of the plurality of spacer precursors. One or more sacrificial layers are formed on sidewalls of the plurality of spacers. A first dielectric is deposited over the substrate to form a first interlayer dielectric (ILD) layer between the one or more sacrificial layers. Further, the one or more sacrificial layers are removed, at least in part, from the sidewalls of the plurality of spacers, leaving one or more cavities in their place.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a pair of metal lines over a substrate;
an interlayer dielectric (ILD) layer laterally between the pair of metal lines; and
a pair of spacers on opposite sides of the ILD layer and laterally separated from the ILD layer by a pair of cavities, wherein the pair of cavities are delimited by sidewalls of the ILD layer and sidewalls of the pair of spacers,
wherein the sidewalls of the pair of spacers comprise one or more amines.

2. The integrated chip of claim 1, wherein the ILD layer comprises a first dielectric and the pair of spacers comprise a second dielectric.

3. The integrated chip of claim 1, wherein the sidewalls of the ILD layer face the pair of spacers, and wherein the sidewalls of the pair of spacers face the ILD layer.

4. The integrated chip of claim 1, wherein widths of top surfaces of the pair of metal lines are less than widths of bottom surfaces of the pair of metal lines.

5. The integrated chip of claim 1, further comprising:
an etch-stop layer over the pair of spacers and over the ILD layer, wherein the etch-stop layer extends directly between the pair of spacers and the ILD layer.

6. The integrated chip of claim 1, wherein top surfaces of the pair of spacers are directly over bottom surfaces of the pair of metal lines, and wherein the pair of cavities are directly over bottom surfaces of the pair of spacers.

7. The integrated chip of claim 1, wherein a distance between the pair of spacers measured along an upper surface of the ILD layer is greater than a distance between the pair of spacers measured along a lower surface of the ILD layer.

8. The integrated chip of claim 1, wherein the one or more amines further delimit the pair of cavities.

9. An integrated chip, comprising:
a metal line over a substrate;
a pair of spacers on opposite sides of the metal line; and
an interlayer dielectric (ILD) layer on opposite sides of the pair of spacers and laterally separated from the pair of spacers by a pair of cavities, wherein the pair of cavities are delimited by sidewalls of the ILD layer and first sidewalls of the pair of spacers,
wherein a distance between the pair of cavities measured along a top of the metal line is less than a distance between the pair of cavities measured along a bottom of the metal line.

10. The integrated chip of claim 9, further comprising:
one or more amines disposed on the first sidewalls of the pair of spacers.

11. The integrated chip of claim 9, wherein a distance between the pair of spacers measured along the top of the metal line is less than a distance between the pair of spacers measured along the bottom of the metal line.

12. The integrated chip of claim 9, wherein angles between bottom surfaces of the pair of spacers and the first sidewalls of the pair of spacers are less than 90 degrees.

13. The integrated chip of claim 12, wherein angles between the bottom surfaces of the pair of spacers and second sidewalls of the pair of spacers are greater than 90 degrees.

14. The integrated chip of claim 9, wherein angles between bottom surfaces of the ILD layer and the sidewalls of the ILD layer are greater than 90 degrees.

15. An integrated chip, comprising:
a pair of metal lines over a substrate;
an interlayer dielectric (ILD) layer laterally between the pair of metal lines; and
a pair of dielectric spacers on opposite sides of the ILD layer and laterally separated from the ILD layer by a pair of cavities, wherein the pair of cavities are delimited by sidewalls of the ILD layer and sidewalls of the pair of dielectric spacers,
wherein the pair of cavities are directly over the sidewalls of the pair of dielectric spacers, respectively, and wherein the sidewalls of the pair of dielectric spacers extend directly over bottom surfaces of the pair of dielectric spacers.

16. The integrated chip of claim 15, further comprising:
an etch-stop layer over the pair of metal lines, over the pair of dielectric spacers, and over the ILD layer, wherein a pair of portions of the etch-stop layer delimit tops of the pair of cavities, respectively, and wherein the pair of portions of the etch-stop layer are directly over the sidewalls of the pair of dielectric spacers and the bottom surfaces of the pair of dielectric spacers.

17. The integrated chip of claim 16, wherein the etch-stop layer extends directly between the pair of dielectric spacers and the ILD layer.

18. The integrated chip of claim 15, wherein a bottom surface of the ILD layer is below bottom surfaces of the pair of metal lines.

19. The integrated chip of claim 15, wherein the pair of dielectric spacers extend directly over bottom surfaces of the pair of metal lines.

20. The integrated chip of claim 15, wherein the ILD layer comprises a first dielectric and the pair of dielectric spacers comprise a second dielectric.

* * * * *